United States Patent

Wicks et al.

[11] Patent Number: 6,143,139
[45] Date of Patent: *Nov. 7, 2000

[54] METHOD FOR RECOVERING METALS FROM WASTE

[75] Inventors: George G. Wicks, North Augusta, S.C.; David E. Clark; Rebecca L. Schulz, both of Gainesville, Fla.

[73] Assignees: The United States of America as represented by the United States Department of Energy, Washington, D.C.; University of Florida

[ * ] Notice: This patent issued on a continued prosecution application filed under 37 CFR 1.53(d), and is subject to the twenty year patent term provisions of 35 U.S.C. 154(a)(2).

[21] Appl. No.: 09/199,696

[22] Filed: Nov. 25, 1998

Related U.S. Application Data

[63] Continuation of application No. 08/605,293, Jan. 19, 1996, Pat. No. 5,843,287, which is a continuation-in-part of application No. 07/866,780, Apr. 1, 1992, Pat. No. 5,891,011.

[51] Int. Cl.[7] .............................. C07C 1/00; A62D 3/00; H05B 6/64
[52] U.S. Cl. ........................ 204/157.43; 204/157.15; 588/252; 588/253; 588/256; 219/678
[58] Field of Search .................. 204/157.43, 157.15; 588/2, 11, 252, 253, 256; 219/678

[56] References Cited

U.S. PATENT DOCUMENTS 5,843,287  12/1998  Wicks et al. .................. 204/157.15

*Primary Examiner*—Kathryn Gorgos
*Assistant Examiner*—Edna Wong
*Attorney, Agent, or Firm*—J. Bennett Mullinax; James Durkis; William R. Moser

[57] ABSTRACT

A method for recovering metals from metals-containing wastes, and vitrifying the remainder of the wastes for disposal. Metals-containing wastes such as circuit boards, cathode ray tubes, vacuum tubes, transistors and so forth, are broken up and placed in a suitable container. The container is heated by microwaves to a first temperature in the range of approximately 300–800° C. to combust organic materials in the waste, then heated further to a second temperature in the range of approximately 1,000–1,550° C. at which temperature glass formers present in the waste will cause it to melt and vitrify. Low-melting-point metals such as tin and aluminum can be recovered after organics combustion is substantially complete. Metals with higher melting points, such as gold, silver and copper, can be recovered from the solidified product or separated from the waste at their respective melting points. Network former-containing materials can be added at the start of the process to assist vitrification.

5 Claims, 1 Drawing Sheet

METHOD FOR RECOVERING METALS FROM WASTE

This application is a continuation of application Ser. No. 08/605,293 filed Jan. 19, 1996 now U.S. Pat. No. 5,843,287 which is a continuation-in-part of application Ser. No. 07/866,780 filed Apr. 1, 1992 now U.S. Pat. No. 5,891,011.

The United States Government has rights in this invention pursuant to Contract No. DEAC09-89SR18035 between the U.S. Department of Energy and Westinghouse Savannah River Company.

BACKGROUND OF THE INVENTION

1. Field of the Invention

The present invention relates to a method for recovering metals from wastes. In particular, the present invention relates to a method for recovering re-usable metals from waste electronic components, and vitrifying the waste residue using microwave energy.

2. Discussion of Background

The proper disposal of all kinds of wastes is an important issue. In particular, the disposal of hazardous wastes: biological, chemical and radioactive, is of concern to generators, regulatory officials and the public. These waste materials can present a hazard if they re-enter the environment. Furthermore, there is the related issue of reduction of-waste volume and minimization of disposal space. Although progress has been made in reducing the volume of wastes generated and in recycling some components of the wastes, there remains a large volume of material that must be safely disposed of.

Many solid wastes, including waste electronic components such as used circuit boards, vacuum tubes, transistors, relays, wiring, television screens and computer monitors, remote controls, personal computers and calculators, contain metals, organic compounds and potentially leachable constituents. With the ever-increasing use of electronic devices in our society, there is a growing interest in the safe disposal of these types of wastes. Furthermore, even though the amount of metal in a single discarded electronic component is small, many millions—perhaps billions—of such components are discarded each year. This number is increasing along with the growing number of electronic devices in business, industry, military and household use. In the U.S. alone, such wastes may contain many thousands of pounds of potentially useful, valuable metals, including gold, silver and copper. There are no known, routinely-used, cost-effective methods for recovering the various metals found in a variety of waste electronic components.

A number of techniques have been used in stabilizing and encapsulating hazardous wastes and the literature abounds with descriptions of these. A particularly effective technique, called vitrification, is the encapsulation of wastes in glass. Glass is very stable against chemical attack. Vitrification has been studied for decades in connection with radioactive wastes. Typically in vitrification, the waste is slurried with glass frit into a glass melter where the glass is heated until it is molten. The waste is incorporated into the glass matrix in such a way that the final, cooled product will resist leaching of the waste for very long periods of time.

In other applications of vitrification, electrodes are placed directly in contaminated earth, which typically has a significant silicate component, and a voltage applied. The resistance of the ground results in sufficient joule heating to vitrify the waste in-situ.

Heat can be applied to wastes using a variety of electrical and thermal heating processes. The use of electric melting concepts is well known for incorporating waste into glass and the use of microwave energy is a favored technology for treating halogenated hydrocarbons. Varma (U.S. Pat. No. 4,935,114) brings toxic wastes into contact with a bed of non-metallic, absorbing particles, such as activated carbon, then heats the waste to 500°–600° C. to destroy the wastes chemically.

In all electrical and thermal waste treatment processes, there is a need for a method for recovering re-usable materials, including precious metals from waste electronic components. Preferably, the method should be simple, flexible and effective, reduce the overall volume of waste substantially, and produce a stable, durable product.

SUMMARY OF THE INVENTION

According to its major aspects and broadly stated, the present invention is a method for recovering metals from wastes, and encapsulating and immobilizing the residue of the wastes for disposal. The method can be used to recover precious metals from waste electronic components and wastes that may contain potentially hazardous constituents. Metals recovery, encapsulation and immobilization are accomplished in a simple process that can be accomplished remotely and using equipment that can be easily transported. The method of the present invention results in significant volume reduction and in the formation of a highly durable waste glass product. The method comprises the steps of applying microwave energy to the waste to raise its temperature sufficiently to combust organic material present in the waste, then continuing to apply microwave energy to the waste to further increase its temperature up to the range of approximately 1,100° C. to 1,550° C., or more. When the waste is held at this second, higher temperature, it will melt and vitrify, assuming it has sufficient glass formers such as silicates in it. If it does not, glass formers can be added. Once vitrified, the waste is allowed to cool and may subsequently be disposed of. Metals contained in the waste may be recovered at several stages of the process: low-melting-point metals during the organics-combustion stage, and higher-melting-point metals during melting of the waste or after the waste has cooled.

An important feature of the present invention is the separation and recovery of re-usable metals, including precious metals, from the waste residue. Surprisingly, it has been found that metals contained in the wastes separate out as the wastes are heated and melted, and remain substantially separated from the remainder of the wastes when the melted wastes cool. These metals may be recovered at several stages of the process: low-melting-point metals such as tin and aluminum are recoverable during or after organics combustion, and higher-melting-point metals such as gold, silver, and copper, after the vitrified waste cools. If desired, metals may be separated from the wastes according to melting point during heating and melting of the wastes.

Another important feature of the present invention for wastes containing glass-forming components is that it requires no additive other than heat. For wastes such as fiberglass, syringes and circuit boards, there are sufficient glass formers present and the effect of the process is to immobilize the wastes safely, without additives, to reduce the volume by 50% or more, and to recover any metals present in the wastes. For medical wastes such as syringes and intravenous items, organics are combusted before remaining waste constituents are vitrified.

Another feature of the invention is the ability to adjust the composition of the final waste glass product. Whether glass formers are added to compensate for a shortage of silicates or other glass formers in the wastes, or whether the wastes have sufficient glass formers to begin with, the product has good leaching resistance and can be disposed of in an ordinary landfill. Alternatively, the product can be used as a filler in materials such as concrete, asphalt, brick and tile. If the wastes contain certain contaminants such as lead and arsenic, chemical compounds can be added to the melt that chemically bind these contaminants, as is well-known in the chemical arts.

Still another feature of the invention is the use of microwaves to heat the wastes. Microwaves allow careful control of the temperature of the wastes, yet enable a rapid temperature increase, and can heat the wastes to higher temperatures than many conventional melters. Susceptors can also be used to aid the heating operation. Susceptors are materials that absorb microwaves quickly and then radiate heat energy to heat adjacent materials that are somewhat slower to respond to the microwaves. The use of this hybrid heating concept—microwave energy plus heat energy—allows metals-containing wastes to be treated in a microwave process.

Aside from efficiency, an advantage of accurate temperature control is the ability to adjust the rate of organics combustion to the process off-gas system. A too-rapid combustion of organics can overwhelm the off-gas system and allow discharge of particulates to the atmosphere. Another advantage of the use of microwaves is that they enable much smaller melters than the conventional joule-heated variety: a microwave melter is small enough to be transported to the source of the waste or moved from place to place at a disposal site. Microwave melters can also be made for remote handling of wastes when the wastes are highly radioactive or especially hazardous.

Other features and advantages of the present invention will be apparent to those skilled in the art from a careful reading of the Detailed Description of a Preferred Embodiment presented below.

DETAILED DESCRIPTION OF A PREFERRED EMBODIMENT

The present invention is a method for recovering metals from wastes and immobilizing the waste residue in a stable, durable matrix. The method is appropriate and economical for wastes containing potentially hazardous, leachable constituents because of the high level of stability required and the generally high costs of safe disposal of these wastes. The present method is especially well-suited for wastes containing silicates, such as electronic components and syringes, but silicates or other materials can be easily added to any waste to produce the composition required for vitrification.

Crucial to the method is the use of microwaves for heating the wastes, because of the higher temperatures that can be reached, the greater control available with microwaves and the faster rate of temperature increase. Use of hybrid heating concepts assists this operation.

Figure 1:
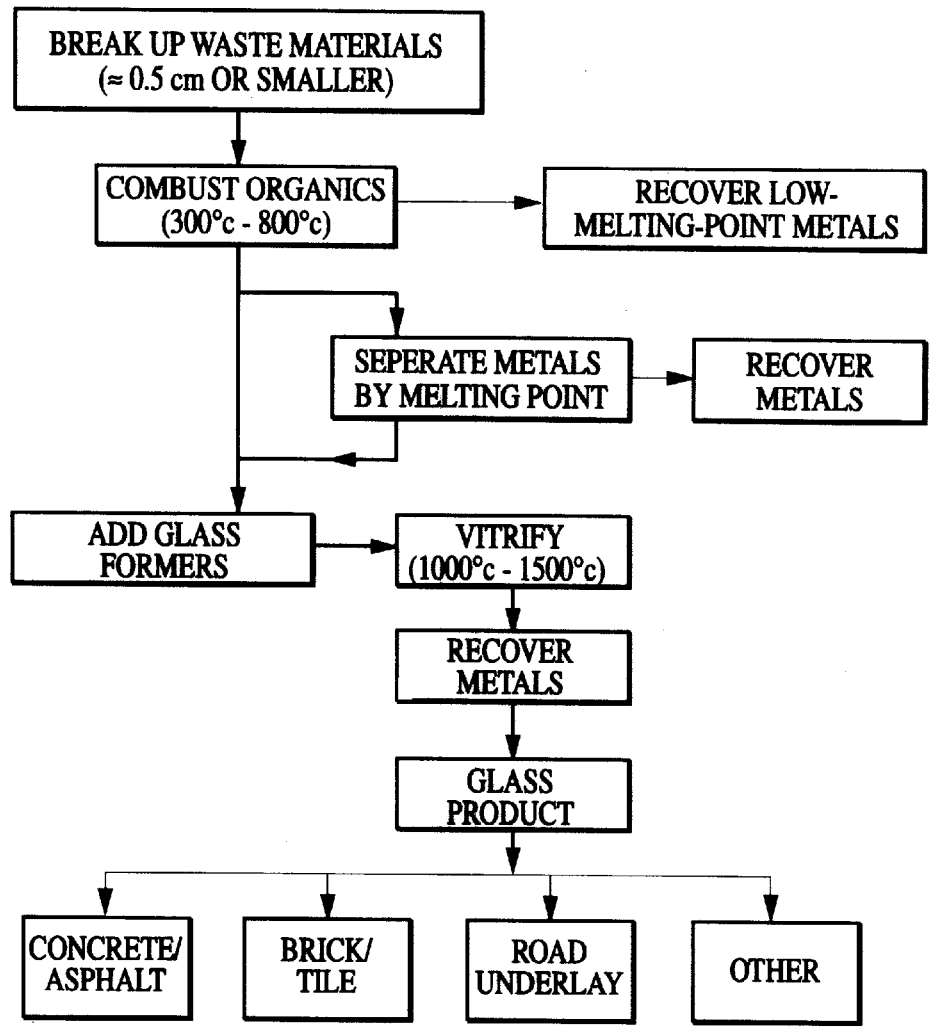
FIG. 1 is a flow chart of a method for recovering metals from wastes according to a preferred embodiment of the present invention.

Referring now to FIG. 1, there is shown a flow chart of a method for treating wastes according to a preferred embodiment of the present invention. The method is carried out generally as follows:

1. Break up the waste materials into pieces to assist melting, and place into a container that can withstand high temperatures.

Breaking up the wastes into small pieces, preferably pieces on the order of 0.5 cm or smaller in size, assists placement in a container for melting, and also facilitates melting and mixing with glass formers (if needed to ensure complete vitrification). The wastes may be cut, crushed, or ground or pulverized to produce a powder if desired. The wastes are then placed into a crucible of a ceramic or other material that can withstand high temperatures, that is, temperatures of approximately 2,000° C. Suitable containers include fused silica or alumina crucibles.

Wastes that can be treated by the method include syringes and other metals-containing medical wastes, and electronic components such as circuit boards, vacuum tubes, transistors, integrated circuits, relays, switches and wiring, television screens and computer monitors, light bulbs, etc. These types of electronic components are found in a wide variety of products, including computers, television sets and other audiovisual equipment, power supplies, remote controls, etc.

2. Using microwave energy, heat the wastes to a first temperature $T_1$ to combust organic materials in the wastes.

The wastes are maintained at the first temperature until any organic materials present in the wastes are substantially combusted, that is, reduced to ash. The first temperature is preferably in the range of approximately 300° C. to 800° C., however, the optimum temperature for combustion may vary depending on the composition of the wastes. Temperatures outside this range may also be useful for some types of wastes. To reduce emissions of combustion byproducts to the environment, the off-gas generated during organics combustion may be vented through an off-gas system that removes particulates Organic compounds typically generate particulates and off-gas as they decompose. Some organic compounds decompose rapidly when heated to a specific temperature range, generating very large amounts of off-gas, but decompose relatively slowly at temperatures outside this range. In general, the more rapid the decomposition, the more rapid the generation of off-gas and particulates. Depending on the composition of the wastes, off-gas constituents may include carbon monoxide (CO), carbon dioxide ($CO_2$), nitrogen oxides (NO, $NO_2$), halogen compounds and volatile organics. If present in sufficient concentrations, some of these gases can ignite and burn, potentially damaging process equipment and presenting a safety hazard to personnel. There is a need to control the release of these gases so they will not ignite uncontrollably and can be handled by an off-gas system.

Heating the wastes to a first temperature, preferably a temperature at which any organics in the wastes decompose sufficiently slowly to be handled by the off-gas system, and maintaining that temperature until the organics are substantially combusted, ensures that off-gases are released in a controlled manner to prevent spontaneous ignition.

The rate of temperature rise is preferably at least approximately 100° C. per minute, however, different rates may also be useful as long as the rate is controlled. Rapid heating is desirable to ensure an efficient process, however, if the rate is too fast the off-gas system may be unable to cope with the amount of airborne particulates and the volume of off-gas produced by the decomposing organics. The optimum rate and temperature $T_1$ will therefore depend on the types and quantities of organics known to be in the wastes, and the capabilities of the off-gas system.

If desired, the off-gas may be monitored to determine when organics in the wastes are substantially combusted. For example, the off-gas $CO_2$ or $NO_x$ concentration may be measured, and the temperature of the waste maintained at the first temperature until the concentration drops below a predetermined value. Alternatively, the temperature may be maintained at the first temperature for a predetermined period of time, depending on the composition of the wastes, the particular apparatus used for treating the wastes, and the amount of waste material to be treated. The optimum time is best determined by a modest amount of observation and experimentation for each particular application.

At temperature $T_1$, no significant melting of silicates (or other glass formers) will take place, although other waste constituents may melt or soften. However, low-melting-point metals may separate out from the wastes and settle to the bottom of the container. By way of example, tin (Sn) has a melting point $T_m=232°$ C., zinc (Zn), a melting point of 419° C., and aluminum (Al), a melting point of 660° C. If desired, these metals may be recovered from the waste before proceeding to Step 3.

3. If desired, break up the combusted wastes by crushing, milling, pulverizing or some other suitable process.

4. Using microwave energy, heat the wastes to a second temperature $T_2$ to melt the wastes. Step 4 may be carried out in the same container and microwave heating apparatus as Step 2, or in a different container and different apparatus, depending on the amount and composition of the wastes to be treated, and the capacity of the apparatus.

The wastes may be placed inside a susceptor to facilitate melting, and an industrial-type microwave containing the proper protection against arcing and damage is strongly preferred. It is well known that metals strongly reflect microwaves instead of absorbing them, therefore, waste materials that contain significant amounts of metals and alloys cannot be safely and efficiently melted by microwaves alone. The susceptor preferably contains a substance with good dielectric coupling characteristics, that is, a substance whose orbital electrons are directly coupled with the incident microwaves. The rise in temperature that results from direct coupling is known as "internal heating"; other forms of heating (radiant, convection, conduction) do not involve direct coupling and are known as "external heating." When the susceptor is heated by microwaves, it readily absorbs microwave energy and, as its temperature rises, radiates heat energy to melt any metals contained in the wastes. The non-metal waste constituents are melted by "hybrid heating," a combination of microwave energy and heat energy.

At temperatures in the range of approximately 1,100° C.–1,550° C., glass formers in the wastes will melt, as will metals having melting points in this temperature range. The wastes are maintained at temperature $T_2$ until the glass formers and at least a portion of these metals melt, preferably for at least approximately five minutes.

5. If needed, add glass formers to the wastes.

If there are insufficient silicates or other glass formers present in the wastes, the wastes may not be completely vitrified. In that case, silicates or other materials that contain network formers, including but not limited to borosilicate glass, quartz, fiberglass, alumina, boron, germanium oxide ($GeO_2$), and phosphorus pentoxide ($P_2O_5$) can be added to the wastes and the microwave energy reapplied. The term "network former" as used herein, refers to components such as silicon (Si) that make up the backbone structure of a glassy material. Depending on the composition of the wastes and the metals to be recovered, other materials such as glass modifiers and intermediates may be added.

Once the mixture of waste, glass formers and other additives (if present) is heated to a temperature in the range of approximately 1,100° C.–1,550° C., the glass formers will melt and encapsulate the wastes. Alternatively, the wastes may be analyzed before treatment to determine whether sufficient glass formers are present for vitrification. Then, the types and amounts of glass formers and other additives needed to provide the desired final product composition are added to the wastes, either before heating to the first temperature (Step 2) or before heating to the second temperature (Step 4).

For example, the composition of circuit boards depends on the end use, the manufacturer, and the date of manufacture. The substrate of a circuit board can be composed of any of a variety of polymeric or ceramic materials, or a combination of materials. Some types of boards are reinforced by glassy fiber mats that have a high silica content. If the wastes being processed include circuit boards, the type of board determines whether or not network formers must be added prior to vitrification. Typically, fiber-mat-reinforced boards can be vitrified without additives, while unreinforced boards may require supplemental glass formers.

6. Recover metals from the wastes.

As the wastes are heated to temperature $T_2$ and maintained at approximately that temperature (Step 4), any metals with melting points lower than $T_2$ will melt. Surprisingly, the melted metals do not remain mixed with the remainder of the wastes, but tend to separate from the wastes and settle to the bottom of the container. Furthermore, these metals remain separated as the melted wastes cool. As a result, the cooled waste is not an amorphous mixture of metals, ash, etc., but contains well-defined metallic nodules or spheres in a glassy substrate. After cooling, the metal spheres may be separated from the waste residue by any convenient means.

Many waste materials—and mixtures of different types of materials—contain a plurality of metals or alloys with different melting points $T_a<T_b<\ldots<T_n$. To recover a metal or alloy having a lowest melting temperature $T_a$, the wastes are heated to a third, intermediate temperature $T_3$, where $T_a \leq T_3 \leq T_b$, and held at $T_3$ until that metal melts and separates from the remainder of the wastes. After the first metal is recovered, the wastes are heated to a next intermediate temperature $T_b \leq T_3 < T_c$ to recover the metal with the next lowest melting point. This process may be repeated for all recovexable metals and alloys that have melting points less than approximately 1550° C. Depending on the types of wastes being treated and the particular selection of process equipment, metals with higher melting points may also be recovered, for example, palladium ($T_m=1,552°$ C.) and platinum ($T_m=1,769°$ C.).

By way of example, a mixture of waste electronic components may contain silver ($T_m=961°$ C.), gold ($T_m=1,063°$ C.), and copper ($T_m=1,083°$ C.). To separate and recover these metals, the wastes are heated to a temperature $T_3$, where 961° C.$<T_3<$1,063° C., and held at that temperature until the silver melts and can be removed from the remainder of the waste. The wastes are then heated to a temperature 1,063° C.$<T_3<$1,083° C. to melt and recover the gold, then to a temperature of at least 1,083° C. to melt and recover the copper. Then, the temperature is raised to the second temperature to melt and vitrify the waste residue.

Alternatively, the wastes are heated to a sufficiently high temperature for substantially all potentially recoverable metals to separate out as a single metallic phase. Each species of metal may then by separated and recovered by any suitable chemical or physical technique. For example, wastes that contain silver, gold and copper may be heated to a temperature of at least 1,083° C., and held at that temperature until the metals separate out from the remainder of the waste.

7. Recover the waste glass product.

The product is in the form of a chemically stable, homogeneous glassy matrix that encapsulates the remaining waste constituents, having a volume less than approximately 50% of the original waste volume. The composition of the product depends on the types of wastes being treated, process temperatures, and whether or not additional glass formers were added. The product is a stable, durable material that meets Environmental Protection Agency (EPA) leaching standards, thus, may safely be disposed of in an ordinary landfill. Alternatively, the product may be crushed or pulverized and used as a filler in construction materials such as brick, concrete, asphalt, tile, fencing and roofing materials, as a road underlay, and so forth.

As noted above, maintaining the wastes at the first temperature $T_1$ (Step 2) ensures that organics are destroyed in a controlled manner. Combustion of organics before vitrification has the additional advantage of ensuring a more reliable waste glass composition. If the wastes are heated directly to the second temperature $T_2$, the organics may decompose so rapidly and uncontrollably that the off-gas cannot be safely handled by the process off-gas system. Even if all the organics in the wastes are decomposed to ash and off-gas, some of the off-gas may be trapped in the melted waste in the form of bubbles. Depending on the types and amounts of organics originally present in the wastes, this could result in a porous product rather than a solid, homogeneous and uniform waste glass. If, on the other hand, organics are substantially combusted before melting the waste at the second temperature, the final product is more homogeneous, substantially nonporous, and satisfies EPA leaching standards.

Figure 2:
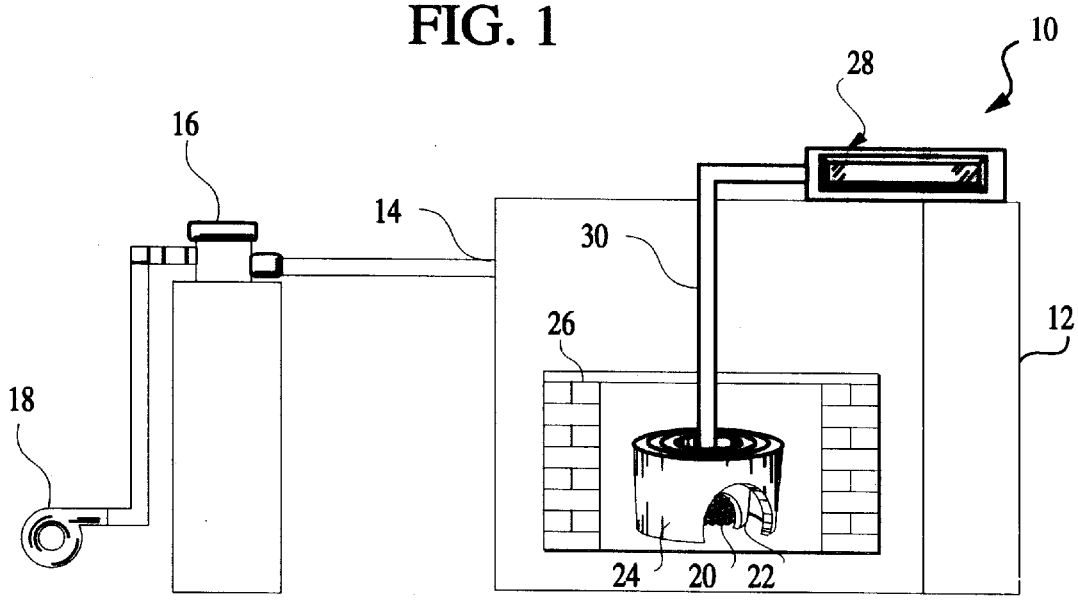
FIG. 2 is a schematic view of an apparatus for recovering metals by the method of FIG. 1.

Referring now to FIG. 2, there is shown an apparatus for treating waste materials according to a preferred embodiment of the present invention. An apparatus 10 includes a microwave oven 12, an exhaust outlet 14, a condenser 16 (a liquid nitrogen cold finger or some other suitable type of condenser) to trap volatile organics and reduce particle emissions to the environment during operation of apparatus 10, and a vacuum pump 18. Microwave oven 12 is any suitable type of microwave oven having a sufficient power output to treat the desired quantities of wastes. Oven 12 may be lined with a refractory material, such as refractory fiber board. Apparatus 10 may also include filters, scrubbers, and so forth for treating off-gas and particulates released by materials heated in oven 12, and devices for monitoring off-gas constituents (not shown). The method of the present invention may be implemented in apparatus 10, or indeed in any apparatus that has sufficient heating capability to treat the desired types and quantities of wastes.

A quantity of wastes 20 (not shown) is placed inside a suitable container 22 (not shown), preferably a fused silica or alumina crucible. Container 22 is positioned inside a susceptor 24. Refractory bricks 26 may be placed around crucible 24 (not shown) to protect the microwave cavity of oven 12 from heat released during combustion of organics (Step 2). A thermocouple unit 28, for example, an INCONEL™-shielded K-type thermocouple, may be used to monitor the temperature of wastes 20 by means of a probe 30. Unit 28 may include a pyrometer or other suitable devices connected to the control system of oven 12 to control the temperature. Apparatus 10 may be placed inside a fume hood (not shown).

In operation, wastes to be treated in apparatus 10 are sectioned, crushed and placed in container 22. Container 22 is placed inside susceptor 24 in oven 12, and wastes 20 are heated to a temperature $T_1$ sufficient to combust organics. Wastes 20 are maintained at a temperature of approximately $T_1$ until any organics in the wastes are substantially combusted. Off-gas constituents may be monitored continuously if desired. After the organics are reduced to ash, emissions are no longer observed and wastes 20 are heated to a second temperature $T_2$ for vitrification.

The method according to the present invention is illustrated in the following non-limiting examples:

EXAMPLE 1

A 100-gram circuit board sample was cut into pieces, pulverized, and placed into a fused silica crucible. The crucible was placed in an 800 W microwave oven lined with refractory fiber board. In addition, alumina refractory bricks were placed around the crucible to further protect the microwave cavity from the heat released during the ashing process. The sample was heated to a first temperature $T_1$, and maintained at that temperature for 84.5 minutes to reduce the pulverized board to ash. The sample was then transferred to a 6,400 W microwave and heated in approximately 12 minutes to a second temperature $T_2$, and maintained at that temperature for approximately 20 minutes.

Several samples were treated, at temperatures $T_1$ ranging from 300° C. to 800° C. and $T_2 = 1,400 \pm 50°$ C. The total weight loss due to volatilization of organics was approximately 56 g; the total volume reduction was greater than 80%.

EXAMPLE 2

Non-reinforced circuit board samples were broken up and heated to a first temperature $T_1$ as described in Example 1. After organics combustion was substantially complete, the remaining waste material was milled for 60 minutes to break up the combusted mass. Borosilicate glass frit in an amount of 10 wt. % of the waste material was added, and the resulting mixture was milled for an additional 30 minutes. The temperature was raised to $1,400 \pm 50°$ C. and held for 25 minutes, at which time the mixture had melted but not completely vitrified. Additional frit (up to 50 wt. % of the original waste sample) was added incrementally, while the temperature was maintained at $1,400 \pm 50°$ C. The final product was a black, glassy mass. Upon removal from the crucible, it was observed that a large, magnetic metallic sphere had settled to the bottom of the crucible, indicating that the metals in the sample had separated from the remainder of the waste. Typical weight losses due to organics combustion were approximately 45%; total volume loss ranged between 52.5% and 1.5%.

EXAMPLE 3

Several commercially-available transistors were analyzed by scanning electron microscopy and energy dispersive spectroscopy (SEM/EDS) to determine the metal content (primarily tungsten, with small quantities of gold, copper and silica). The transistors were crushed and mixed with borosilicate glass frit in a ratio of 1:2 by weight. The mixture was placed in an alumina crucible, positioned inside a zirconia/beta silicon carbide susceptor, placed inside a 6,400 W microwave oven and processed as described above. Total processing time was approximately 15 minutes with a maximum temperature of 1,478° C.

The end product was a blue-green vitreous mass. Destruction of the ceramic/wire portion of the transistor was achieved, however, the processing temperature was not sufficiently high to melt the tungsten base plates, which remained substantially intact.

EXAMPLE 4

A sample consisting of connector pieces from a computer hard drive and crushed transistors was prepared. Organics were combusted in an 800 W microwave oven, then the remaining wastes were transferred to an alumina crucible and placed inside a zirconia/beta silicon carbide susceptor. This assembly was placed inside a 3,200 W microwave. An optical pyrometer was used to control the temperature of the wastes. After organics combustion, the waste was heated to a temperature range of 1,100–1,150° C. for approximately 15 minutes to melt any gold present ($T_m$=1,063° C.). The temperature was then raised to approximately 1,400±50° C., held at that temperature until the waste residue vitrified and cooled. The resulting product was a black, glassy mass, with the tungsten base plates of the transistors substantially intact.

Metals were recovered from the wastes at several stages of the process. Low-melting point metals (Sn, Al) melted and separated out from the wastes during organics combustion (ashing). The metallic spheres formed during ashing were removed using either magnetic or mechanical separation techniques. Several small metallic spheres were recovered from the melt, and the remaining separated metals were removed after the melted wastes had cooled. SEM/EDS analyses of the spheres confirmed that a wide variety of metals could be separated from the wastes, including Au, Ag, Sn, Pb, Fe, Al, Cu, Ti, Ni, Mn, Zn and Si. Because of the wide range of melting points of the metals and alloys used in manufacturing electronic components, metals may be recovered at several points in the process: after organics combustion (Step 2), during heating to the second temperature (Step 4), and after vitrification (Step 5). This feature allows considerable flexibility for treating different types of wastes. By way of example, low-melting-point metals may be removed after organics combustion (Step 2) and the remaining metals after cooling of the vitrified wastes (Step 5). Alternatively, at least some of the metals may be separated by melting point in Steps 2 and/or 4, reducing the need for reprocessing of the metal spheres/nodules obtained after completion of these steps to separate out the different elements.

The wastes may be analyzed to determine whether additional glass formers are needed for vitrification. Some wastes, such as fiber-reinforced circuit board materials, electron tubes, and so forth, already contain sufficient glass formers for vitrification. Other types of wastes may need additional glass formers, either supplied in pure form or as a different type of waste material (for example, light bulbs and other waste glass, syringes, etc.). Depending on the composition of the wastes, addition of modifiers and intermediates may also be useful.

Use of the method allows recovery of metals from heterogeneous wastes (i.e., wastes that contain a variety of constituents), while destroying potentially hazardous organics and reducing the overall waste volume by more than 50%. The waste residue is contained in a stable, nonporous glassy matrix that meets EPA leaching standards, thus, the final product may safely be disposed of in an ordinary landfill, or used as a filler in construction materials. The method may be carried in any type of apparatus that is capable of heating the wastes to the desired process temperatures $T_1$ and $T_2$, including apparatus such as that shown schematically in FIG. 2. Alternatively, organics combustion and vitrification may be carried out in different microwave heaters, or the wastes may be processed continuously rather than batch-wise.

The above-described method may include additional process steps without departing from the spirit of the invention. For example, there are many well-known chemical compounds that attach themselves chemically to certain hazardous materials such as lead and arsenic. If immobilization in a stable, non-hazardous form (rather than recovery) of such materials is desired, these chemicals can be added to the wastes before vitrification so that they have an opportunity to immobilize the hazardous material even more effectively.

It will be apparent to those skilled in the art that many changes and substitutions can be made to the preferred embodiment herein described without departing from the spirit and scope of the present invention as defined by the appended claims.

What is claimed is:

1. A process of recovering metals from waste, said process comprising the steps of:

supplying a waste material comprising a mixture of organic material and metal;

applying microwave energy to said waste to raise the temperature of said waste at a controlled rate to a first temperature, said first temperature sufficient to combust organic materials in said waste;

combusting said organic materials at said first temperature;

applying microwave energy to said waste to raise the temperature of said waste to a second temperature, said second temperature higher than said first temperature and sufficient to melt a first metal in said waste;

holding said waste at said second temperature until said first metal within said waste melts and separates from a residue of said waste;

removing said first melted metal from said waste;

further applying microwave energy to said waste to raise the temperature of said waste to a third temperature, said third temperature higher than said second temperature and sufficient to melt a second metal in said waste;

holding said waste at said third temperature until said second metal contained in said waste melts and separates from said waste; and removing said melted second metal from said waste.

2. The process according to claim 1, comprising the additional steps of applying microwave energy to said waste to raise the temperature of said waste to a fourth temperature, said fourth temperature higher than said first temperature and sufficient to melt a third metal in said waste and, separating said melted third metal from said waste.

3. A method according to claim 1, further comprising the step of allowing said first melted waste to solidify before removing said metal.

4. A method of separating metals from a waste material comprising the steps of:

applying microwave energy to the waste material;

heating said waste material to a melting point of a first metal within said waste material;

allowing said first metal to melt;

separating said melted metal from said waste material;

raising the temperature of said waste material by the further application of microwave energy to a melting temperature of a second metal, said second metal having a higher melt temperature than said first metal;

maintaining said second temperature of said waste material until said second metal melts; and separating said second metal from said waste material.

5. The method according to claim 4, wherein said waste material comprises waste electronic components.

* * * * *